United States Patent [19]

Sicard et al.

[11] Patent Number: 4,705,333
[45] Date of Patent: Nov. 10, 1987

[54] TEST PROBE FOR LEADLESS DEVICES

[75] Inventors: Stephen T. Sicard, Norton; Brian A. Pedro, Attleboro; Wayne S. Alden, III, Whitman, all of Mass.

[73] Assignee: Pylon Company, Inc., Attleboro Falls, Mass.

[21] Appl. No.: 767,809

[22] Filed: Aug. 21, 1985

[51] Int. Cl.⁴ .................. H01R 9/11; H01R 23/02
[52] U.S. Cl. .................. 439/71; 324/158 F; 439/626; 439/482
[58] Field of Search .............. 324/158 F; 339/19 CF, 339/108 TP, 255 R, 59 M, 36, 150 R, 150 A, 150 B, 150 C, 151 R, 151 A, 151 B, 151 C, 151 M, 176 M

[56] References Cited

U.S. PATENT DOCUMENTS

| | | | |
|---|---|---|---|
| 3,646,579 | 2/1972 | DiVita et al. | 339/108 TP |
| 3,885,854 | 5/1975 | Reimer | 324/158 F |
| 3,952,218 | 4/1976 | Deters | 339/60 R |
| 4,538,864 | 9/1985 | Ichimura | 339/17 CF |
| 4,639,058 | 1/1987 | Morgan | 324/158 F |

OTHER PUBLICATIONS

"High-Speed, Low Crosstalk Chip Holder for Josephson Integrated Circuits", by Hamilton, IEEE Transactions, vol. IM-31, No. 2, Jun. 1982.

Primary Examiner—Gil Weidenfeld
Assistant Examiner—Gary F. Paumen
Attorney, Agent, or Firm—Weingarten, Schurgin, Gagnebin & Hayes

[57] ABSTRACT

An electrical test probe assembly for use with a leadless surface mounted device is provided which includes an array of resilient spring contacts in a pattern corresponding to the contacts of a leadless device. The array of spring contacts are configured to grip the peripheral edges of a surface mounted device, with each spring contact in biased engagement with a respective contact of the device.

10 Claims, 10 Drawing Figures

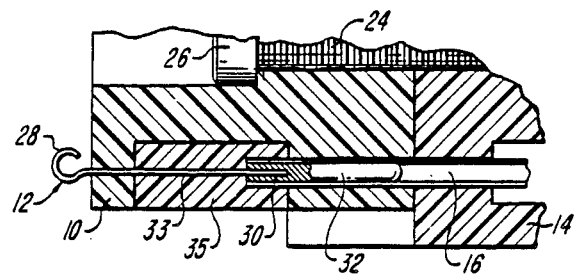
FIG. 5
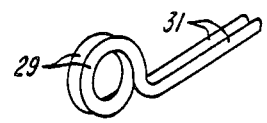
FIG. 6
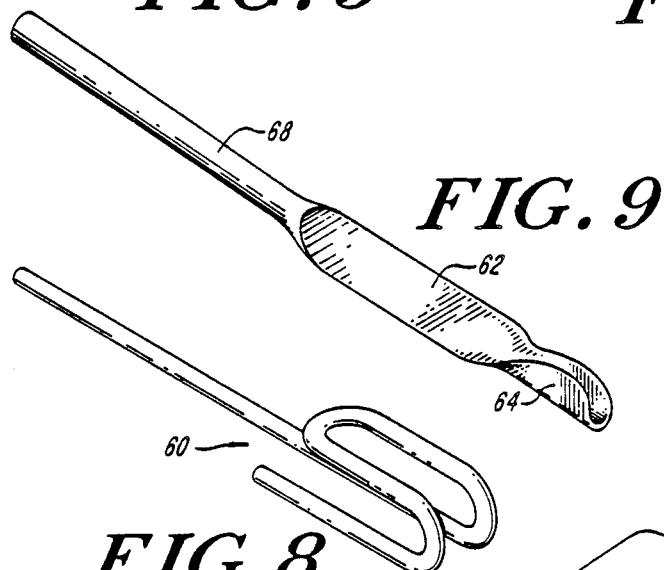
FIG. 9
FIG. 8
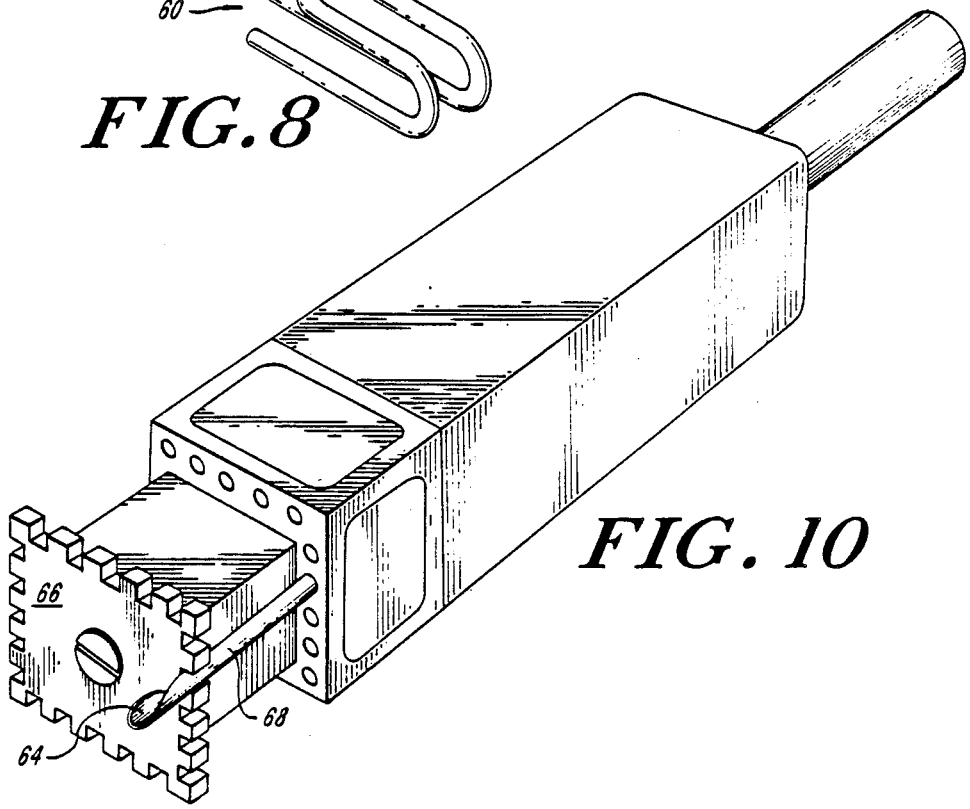
FIG. 10

TEST PROBE FOR LEADLESS DEVICES

FIELD OF THE INVENTION

This invention relates to electrical testing and more particularly to test probes for the testing of electrical and electronic devices and circuits.

BACKGROUND OF THE INVENTION

Test probes are often employed for contacting an electrical or electronic device or circuit in order to test characteristics of the device or circuit. The probes can include a contact configuration for mating with the contacts of a device or circuit under test, such as flat packs and integrated circuits. Probes of known construction are not wholly satisfactory for use with leadless devices such as leadless chip carriers, and are often unduly complex in construction or cumbersome to use.

SUMMARY OF THE INVENTION

The present invention provides a probe assembly especially adapted for attachment to and contact with an array of contacts of a leadless surface mounted device such as a leadless chip carrier. The probe assembly includes a housing having on the forward end thereof an array of resilient spring contacts in a pattern corresponding to the contacts of a device with which the probe is to be mated. The array of spring contacts are configured to be sprung over and grip the peripheral edges of a surface mounted device, with each spring contact in biased engagement with a respective contact of the device. Each spring contact is electrically connected to a respective wire of the probe assembly cable, the cable in turn being connected to automatic circuit test to other utilization apparatus for which the probe assembly provides electrical connection. In a preferred embodiment, the array of spring contacts is in the form of loop ends operative to provide the intended bias force for proper electrical engagement with the respective contacts of the device under test. The spring contacts are supported on an electrically insulative block which can be removably attached to the probe housing, each of the spring contacts having a terminal end releasably connected to a mating terminal portion of the housing. The array of spring probes can thereby be readily detached from and reattached to the housing.

BRIEF DESCRIPTION OF THE DRAWINGS

The invention will be more fully understood from the following detailed description taken in conjunction with the accompanying drawings, in which:

FIG. 5 is a cutaway sectional view of an alternative embodiment;

FIG. 6 is a pictorial view of an alternative resilient looped contact;

FIG. 8 is a pictorial view of a further contact configuration;

FIG. 9 is a pictorial view of a contact configuration having a flatted and formed end; and FIG. 10 is a pictorial view of an alternative probe assembly.

DETAILED DESCRIPTION OF THE INVENTION

Figure 1:
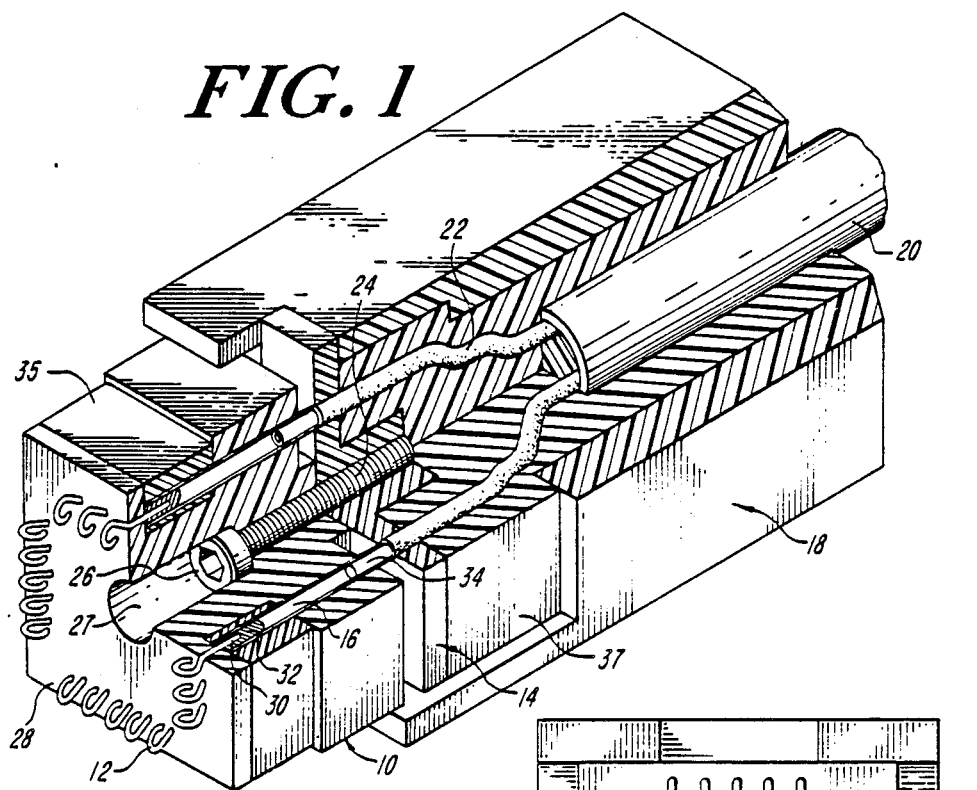
FIG. 1 is a cutaway pictorial view of a probe assembly in accordance with the invention.
Figure 2:
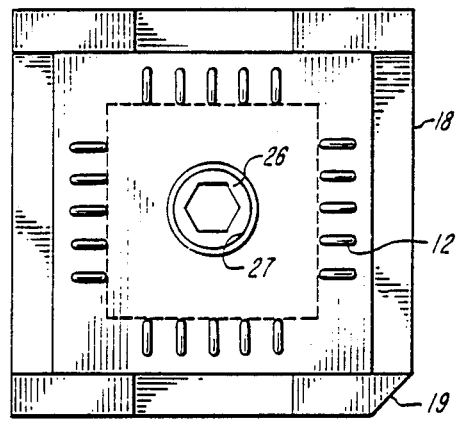
FIG. 2 is a front view of the embodiment of FIG. 1.

A probe assembly for use with leadless surface mounted devices is shown in a preferred embodiment in the drawings. The assembly comprises a forward block 10 supporting an array of resilient contacts 12 and an array of terminals 16, each connected to a respective contact 12, a rearward block 14, and a housing 18 to which the blocks 10 and 14 are mounted. The housing 18 includes a rearward portion which accepts a cable 20 composed of a plurality of wires 22, each of which is connected to a respective terminal 16. The block 10 is removably attached to the block 14 by a threaded fastener 24 which is cooperative with a threaded opening in the block 14, and which is secured and removed via a forward facing head 26 which is accessible via an opening 27 in block 10. The housing can include a key area 19 for polarity indication.

The contacts 12 are each in the form of a resilient wire such as tungsten having a looped contact end 28 and an integral lead terminating in an inner end 30 connected to a respective terminal pin 32 which is slidably secured within one end of the sleeve of respective terminal 16. The other end of each terminal sleeve receives and has secured therein the stripped end 34 of a respective wire 22. The housing and forward and rearward blocks are typically formed of a plastic electrically insulating material. The terminal 16 and the terminal pin 32 are of a suitable conductive material. In the illustrated embodiment, a potting material 35 can be employed to secure the terminals 16, and a potting material 37 can be employed to secure the cable 20 and wires 22.

Figure 3:
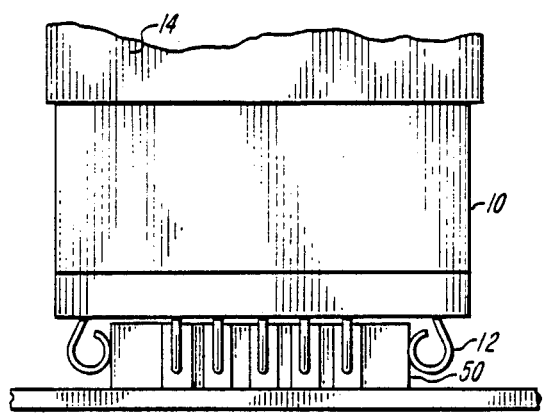
FIG. 3 is a cutaway elevation view of the embodiment of FIG. 1.
Figure 4:
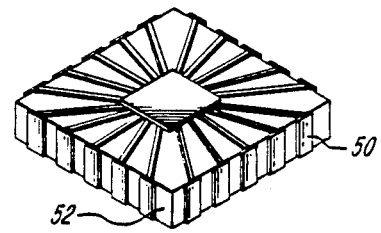
FIG. 4 is a pictorial view of a leadless chip carrier with which the novel probe assembly is employed.

The contact loops 28 are arranged in an array to accommodate the contact pattern of a surface mounted device with which the probe assembly is to be used. In the illustrated embodiment of the contact configuration is of four sided square form to match the corresponding pattern of contact 50 of the device 52 to be tested, as shown in FIG. 4. The contact array is sized to be slightly less than the outlined dimensions of the surface mounted device such that the contacts will be urged apart as the probe assembly is installed onto a device to grip the periphery of the device and provide biased contact of each contact loop 28 and associated contact area of the associated device, as seen in FIG. 3.

The forward block 10 and the contacts 12 supported thereby can be easily removed from the assembly by loosening the fastener 24, for purposes of replacement or repair.

In alternative implementation in FIG. 5, the resilient contact has a longer integral lead 33 which is secured to terminal pin 32. A sleeve 16 is disposed in blocks 10 and 14 and receives pin 32. The space 35 can be filled with a potting compound to enclose and secure the contacts.

The contact end 28 of each contact 12 can also have multiple turns to provide greater contact area. The contacts can also configured as shown in FIG. 6, wherein the contact end has two or more turns 29 of wire and two integral wire leads 31 extending from the loop end and connectable to a terminal pin 32.

Further embodiments of the contact are shown in FIGS. 8 and 9. In FIG. 8 the resilient end 60 is of the serpentine configuration shown. In the embodiment of FIG. 9, the contact has a flatted end portion 62, the distal end of which is formed into a spade-like contact.

Figure 7:
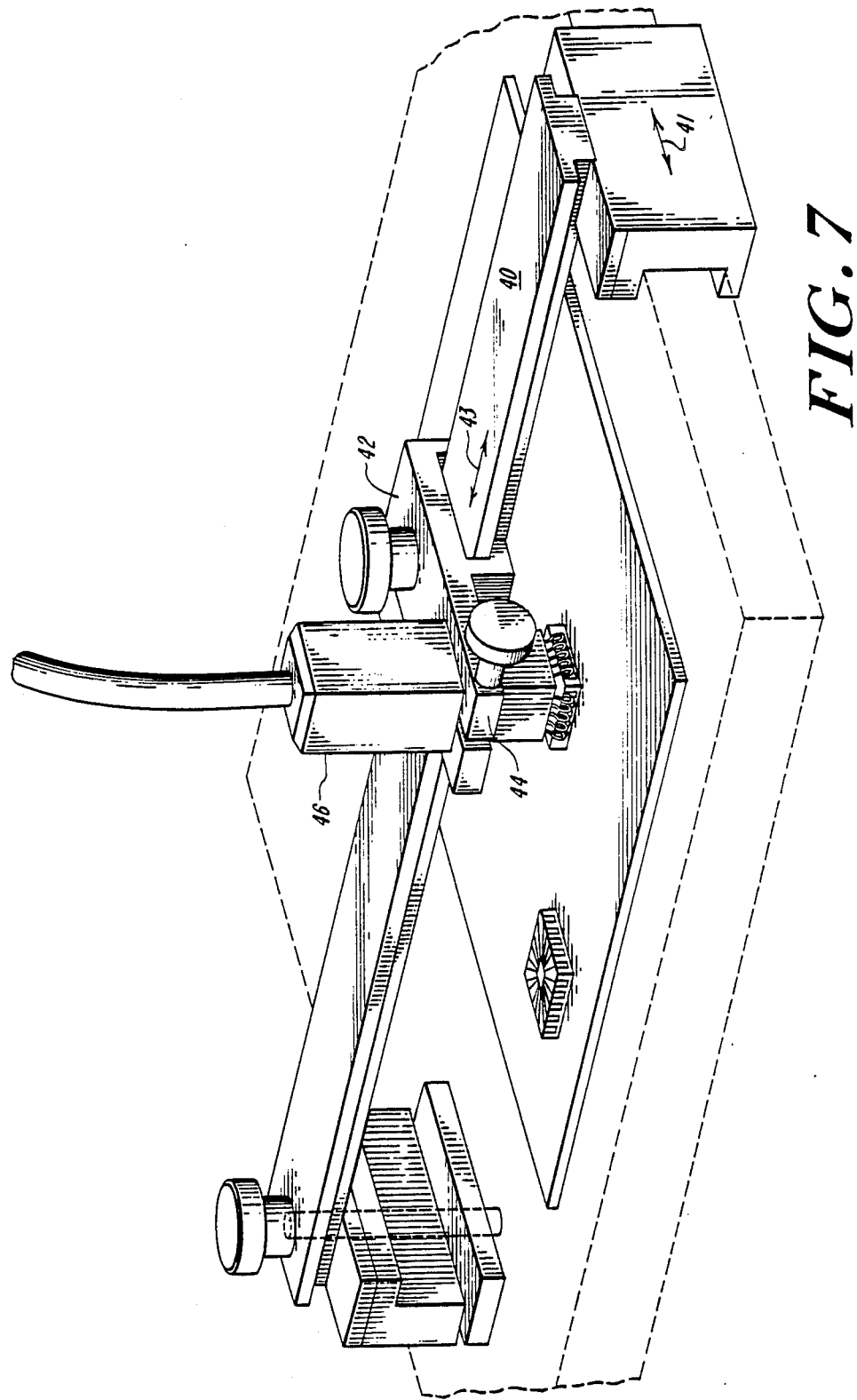
FIG. 7 is a pictorial view of a posting fixture for use in the invention.

The probe assembly can be hand held and plugged onto an associated device for simultaneous contact of all of the contact areas of the device. The probe assembly can also be employed with a positioning fixture, which can also accommodate more than one probe assembly for simultaneous attachment to and testing of a number of surface mounted devices on a circuit board. The positioning fixture is shown in typical embodiment in FIG. 7 and includes a carriage 40 movable along one axis 41 of a work area, and a slide mechanism 42 movable along the carriage axis which is orthogonal to the axis 41, to provide XY movement to any intended position within the work area. A bracket 44 on the slide mechanism is adapted to retain the probe assembly 46 thereon for positioning the assembly to any intended position for engagement with a leadless device.

The contacts can be mounted on a probe assembly in different ways, and details of the probe assembly construction can vary to suit particular constructional and operational requirements. For example, an alternative probe assembly is illustrated at FIG. 10 in which the contacts of the type shown in FIG. 9 are supported on a notched end plate 66 and which can be part of the removable forward block structure described above. A housing or shell can be provided around the exposed contact leads 68, or these exposed leads can be enclosed within an enclosure provided in the recessed space of the assembly.

Accordingly, the invention is not limited by what has been shown and described except as indicated in the appended claims.

What is claimed is:

1. An assembly for releasably making electrical connection to a leadless surface mounted device remote from the assembly by a plug-like mounting and demounting action, the leadless surface mounted device having a peripheral side wall defining a perimeter and plural side contacts provided along the peripheral side wall to which the assembly is able to releasably make contact, comprising:
    a probe housing having a multi-wire cable disposed therein and having a front end;
    a plurality of spring contacts disposed in a predetermined array and outwardly extending from the front end of the probe housing a distance therebeyond selected to provide wiping contact of the leadless surface mounted device, the contacts being individually connected to an associated wire of the multi-wire cable;
    the spring contacts being in a configuration corresponding to the configuration of contacts of the surface mounted device to which the assembly is to be mated;
    the array of spring contacts being disposed about a perimeter which is smaller than the perimeter of the surface mounted device such that the array of spring contacts is able to be received and released from the peripheral side wall of the surface mounted device by a plug-like mounting and demounting action in such a way that the array of spring contacts is able to be resiliently biased into electrical and mechanical engagement with the respective side contacts of the device.

2. The assembly of claim 1 wherein the array of spring contacts is supported on a block of insulative material having a forward surface from which the spring contacts extend, and a rearward surface in which an array of terminals is disposed, each of the terminals being electrically connected to a respective spring contact.

3. The assembly of claim 2 wherein the block is removably attached to the housing by fastener means.

4. The assembly of claim 1 wherein each of the spring contacts includes:
    a wire loop outwardly extending from the forward surface of the probe, and an integral wire lead extending from the loop end inwardly of the probe; and
    means in the probe for electrically connecting the inner end of the integral wire lead of each spring contact to a respective wire of the multiwire cable.

5. The probe assembly of claim 1 wherein the array of spring contacts includes:
    a multiturn wire loop outwardly extending from the forward surface of the probe, and at least one integral wire lead extending from the loop end inwardly of the probe; and
    means in the probe for electrically connecting the inner end of the integral wire lead of each spring contact to a respective wire of the multiwire cable.

6. The assembly of claim 1 wherein the housing includes:
    a forward block of electrically insulating material supporting the spring contacts and having electrical terminals coupled to the spring contacts;
    a rearward block of electrically insulating material having electrical wires of the multi-wire cable coupled to the spring contacts via the terminals; and
    means for maintaining the first and second blocks in engagement.

7. The assembly of claim 6 wherein the forward block is removably attached to the rearward block.

8. The assembly of claim 7 wherein the forward block includes fastener means for securing the forward and rearward blocks together and by which the forward block can be removed from the rearward block.

9. The assembly of claim 1 wherein the spring contacts are of sufficient size to be snapped over the peripheral edges of the device, with each contact in biased engagement with a respective contact of the device.

10. The probe assembly of claim 1 wherein the spring contacts include a conductive lead having an end portion which is flatted and formed to provide a spade-like contact.

* * * * *